(12) United States Patent
Ausserlechner

(10) Patent No.: US 12,099,099 B2
(45) Date of Patent: Sep. 24, 2024

(54) Z MAGNETIC FIELD SENSORS WITH PLANAR CALIBRATION COILS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 81 days.

(21) Appl. No.: 18/056,547

(22) Filed: Nov. 17, 2022

(65) Prior Publication Data
US 2023/0194633 A1 Jun. 22, 2023

(30) Foreign Application Priority Data

Nov. 25, 2021 (DE) .......................... 102021213302.9

(51) Int. Cl.
| | | |
|---|---|---|
| G01R 33/00 | (2006.01) | |
| G01B 7/00 | (2006.01) | |
| G01B 7/14 | (2006.01) | |
| G01R 15/20 | (2006.01) | |
| G01R 19/15 | (2006.01) | |
| G01R 33/02 | (2006.01) | |
| G01R 33/05 | (2006.01) | |
| G01R 33/07 | (2006.01) | |
| G01R 33/12 | (2006.01) | |
| G01R 35/00 | (2006.01) | |
| G01V 3/10 | (2006.01) | |

(52) U.S. Cl.
CPC ..... *G01R 33/0017* (2013.01); *G01R 33/0005* (2013.01); *G01R 33/07* (2013.01)

(58) Field of Classification Search
CPC ........ G01R 33/00; G01R 33/02; G01R 33/05; G01R 33/07; G01R 33/03; G01R 33/12; G01R 35/00; G01R 15/20; G01R 19/15; G01B 7/00; G01B 7/14; G01V 3/10
See application file for complete search history.

(56) References Cited

U.S. PATENT DOCUMENTS 7,605,580 B2 * 10/2009 Strzalkowski ....... G01R 15/207
324/117 R
2017/0030979 A1 2/2017 Cesaretti

* cited by examiner

*Primary Examiner* — Neel D Shah
(74) *Attorney, Agent, or Firm* — Harrity & Harrity, LLP

(57) ABSTRACT

The innovative concept described herein relates to a sensor chip having at least two magnetic field sensors that are arranged adjacently to one another on the sensor chip and measure perpendicularly to the chip plane, wherein at least one of the magnetic field sensors has a planar coil arranged on it that is configured to generate a magnetic field directed perpendicularly to the chip plane. A controller is able to operate the magnetic field sensors in a calibration mode, in which the planar coil generates the magnetic field. For the purpose of calibrating the magnetic field sensors, a differential measurement may be taken that involves the response signal from one magnetic field sensor being subtracted from the response signal from the other magnetic field sensor.

20 Claims, 10 Drawing Sheets

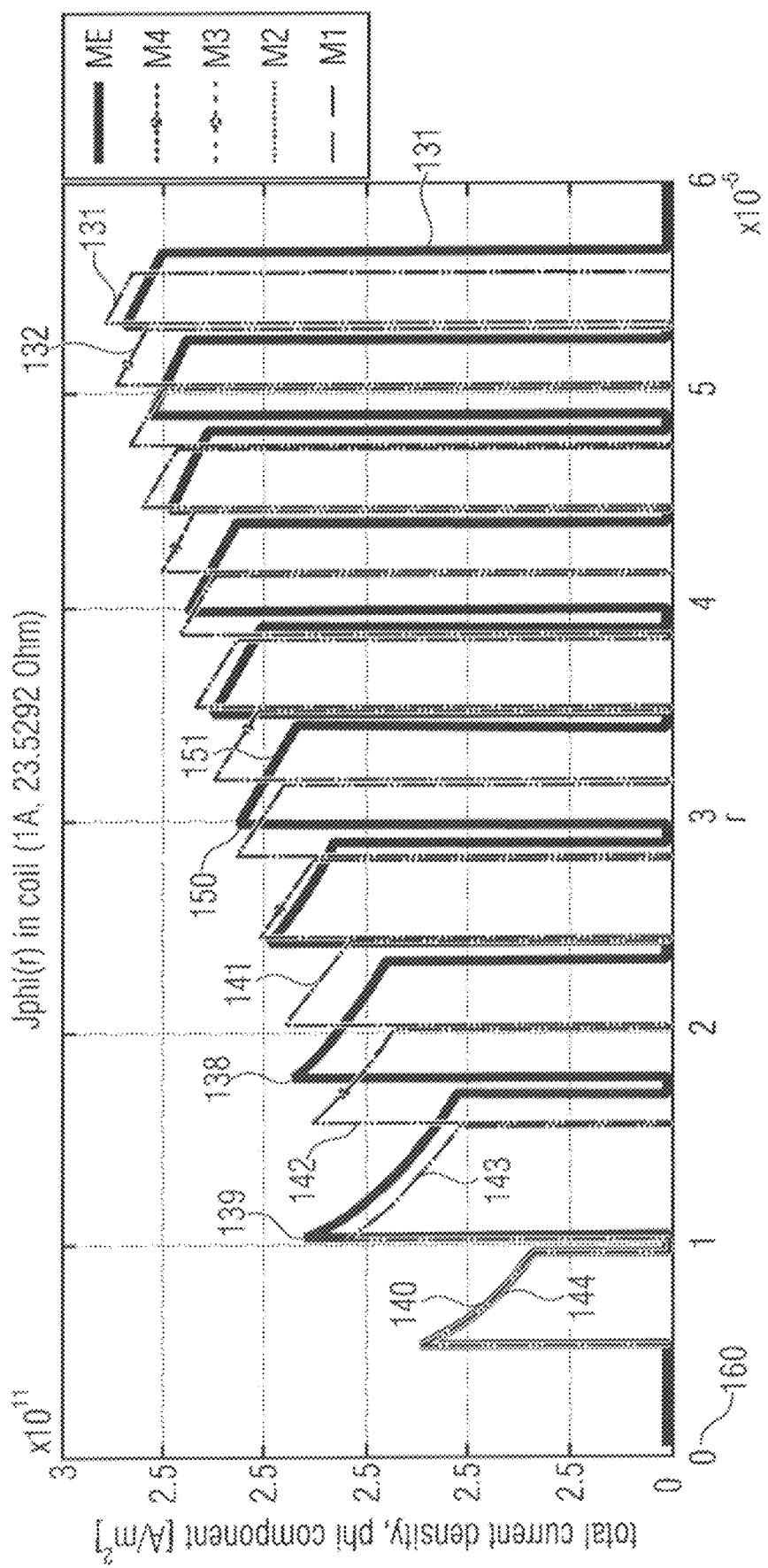

Z MAGNETIC FIELD SENSORS WITH PLANAR CALIBRATION COILS

CROSS REFERENCE TO RELATED APPLICATION

This application claims priority to German Patent Application No. 102021213302.9 filed on Nov. 25, 2021, the content of which is incorporated by reference herein in its entirety.

TECHNICAL FIELD

The innovative concept described herein relates to a sensor chip having at least two magnetic field sensors that measure perpendicularly to the chip plane and may be calibrated by means of at least one planar coil, and to a corresponding method for calibrating such magnetic field sensors.

BACKGROUND

Magnetic field sensors are used to measure external magnetic fields. Depending on the implementation of the magnetic field sensors, magnetic fields may be measured in different directions, the magnetic field component that is directed perpendicularly to the chip plane often being of interest. This magnetic field component is also referred to as the z component, and the direction of magnetization perpendicular to the chip plane is accordingly also referred to as the z direction.

Known types of magnetic field sensors that measure in the z direction are magnetoresistive sensors, such as e.g. AMR (Anisotropic Magnetoresistance) sensors, GMR (Giant Magnetoresistance) sensors, TMR (Tunnel Magnetoresistance) sensors, and the like, which may be combined under the collective term xMR sensors (x-magneto-resistive sensors). If xMR sensors measure perpendicularly to the chip plane, e.g. in the z direction, they may also be referred to as Z-xMR sensors. Z-xMR sensors may be used to influence the resistance value of conductive materials under the influence of an external magnetic field acting in the z direction. Other known types of sensors that measure perpendicularly to the chip plane, e.g. in the z direction, are magnetic field-effect transistors, so-called mag FETs or vertical Hall sensors. Hall sensors refer to circuits having Hall plates for measuring a magnetic field.

These magnetic field sensors measuring in the z direction (subsequently also referred to as z magnetic field sensors) may have an accuracy of ~1% over their life, and within a specific temperature range (e.g. for automotive applications~−40° C. to +150° C.). In order to achieve this high accuracy, z magnetic field sensors need to be calibrated by the manufacturer during a test. This requires a high-precision magnetic field to be applied, and the corresponding response by the sensor circuit to the applied magnetic field is then measured.

In a production environment, however, it is difficult and expensive to provide means for generating such a magnetic field: the magnet specifically manufactured for these calibration purposes needs to be integrated into a standard production line (handling apparatus and test apparatus), which in turn may have ferromagnetic parts (screws, steel), however, that can distort the magnetic field. In addition, the magnet needs to be kept at a constant temperature, whereas the device under test (DUT) itself is tested in a variable temperature range between −40° C. and +150° C. Additionally, the magnet needs to be capable of generating a field that may be simultaneously applied to multiple (e.g. 8 to 64) devices under test that are to be tested in parallel. Often there are considerable magnetic interfering fields in the test rig that can considerably distort the result of the calibration. In addition, the test time should not exceed one second per device under test.

Although z magnetic field sensors are often tested and calibrated at different temperatures, there is no assurance that a specific device under test is able to be tested at all temperatures within the same test rig. Also, should there be only very small differences in the magnet as compared with the magnet specification (e.g. in the order of magnitude of 0.1%), this already leads to a considerable error during repeated calibration over temperature, which ultimately adversely affects calibration accuracy.

It is therefore known practice to use integrated test coils for calibrating z magnetic field sensors. For this purpose, in the case of Hall sensors, for example, a small planar coil may be placed on top of the Hall plates. The planar coil consists of interconnect layers of the semiconductor process. Examples of interconnect layers are the wiring planes of the semiconductor process, which are usually embodied as metal layers (normally in aluminum or copper alloys with small admixtures of silicon). During calibration, a precise current is passed through the coils. The current generates a magnetic field that acts on the Hall plate(s). The calibration merely measures the Hall response and then sets it to a predefined value.

There are also a few problems with integrated calibration coils, however:

a) Pure metal coils, for example, generally generate only a small magnetic field. For a large magnetic field, such a coil needs to be supplied with a high current, or the coil needs to have many turns, e.g. the number of turns needs to be correspondingly large. This leads to considerable intrinsic heating, however, which affects the sensor circuit. The coil not only heats the circuit, it also produces excess heat, the magnitude of which in terms of time and space is not constant. The test engineer therefore needs to optimize the chronology of the magnetic field model applied in order to achieve the best reproducible calibration results. In addition, the coil heats the Hall plate(s) to a greater extent than the rest of the circuit. However, the circuit uses temperature calibration that measures the temperature and adapts the gain factor of the signal conditioning circuit accordingly. That is to say that if the temperature sensor measures a different temperature than the temperature that is actually prevalent at the Hall plates, this leads to an error during calibration.

b) If the coil also generates just a very small magnetic field, the calibration error caused by external magnetic interference is all the more serious. The heating problem and the need for precise current sources for supplying power to the coils means that it is not possible to choose just any frequency-selective methods in order to distinguish different interference in the calibration field from one another.

c) Integrated circuits often use multiple, closely arranged Hall plates (paired arrangements or quadruple arrangements) in order to compensate for systematic offset errors. Additionally, the Hall plates precisely manufactured using silicon technology are normally larger than 50 μm (up to 200 μm). The coil therefore needs to be able to generate a magnetic field over a relatively large spot on the chip (a quartet of four 80 μm Hall plates has a space requirement of 160 µm×160 µm). This reduces the efficiency of the coils further, since an excessively small field exists per degree of excess heat.

The innovative concept described herein provides a way of improving the calibration of z magnetic field sensors, a strong magnetic field being able to be generated with a small space requirement, and at the same time undesirably high temperatures or temperature fluctuations being able to be avoided to the greatest possible extent.

This aim is achieved by way of a sensor chip according to claim 1. Other implementations and advantageous aspects of this sensor chip are cited in the respective dependent patent claims.

The innovative sensor chip disclosed herein has at least two magnetic field sensors that are arranged adjacently to one another on the sensor chip and measure perpendicularly to the chip plane. At least one of the magnetic field sensors has a planar coil arranged on it that is configured to generate a magnetic field directed perpendicularly to the chip plane. The sensor chip also has a controller that is configured to operate the magnetic field sensors in a calibration mode, in which an input signal is applied to the planar coil in order to generate the magnetic field, and in which a response signal for the generated magnetic field is ascertained from each of the two magnetic field sensors. For the purpose of calibrating the magnetic field sensors, the controller may be used in the calibration mode to take a differential measurement involving the response signal from one magnetic field sensor being subtracted from the response signal from the other magnetic field sensor.

BRIEF DESCRIPTION OF THE DRAWINGS

A few example implementations are shown by way of example in the drawing and are explained below. In the drawing:

FIG. 4A shows a schematic view of the current-density distribution in the individual turns of a spiral winding.

DETAILED DESCRIPTION

Example implementations are described in more detail below with reference to the figures, wherein elements having the same or a similar function are provided with the same reference signs.

Method steps that are depicted or described within the context of the present disclosure may also be carried out in a different order than that depicted or described. Additionally, method steps that relate to a specific feature of an apparatus are interchangeable with this very feature of the apparatus, and this also applies vice versa.

Figure 1A:
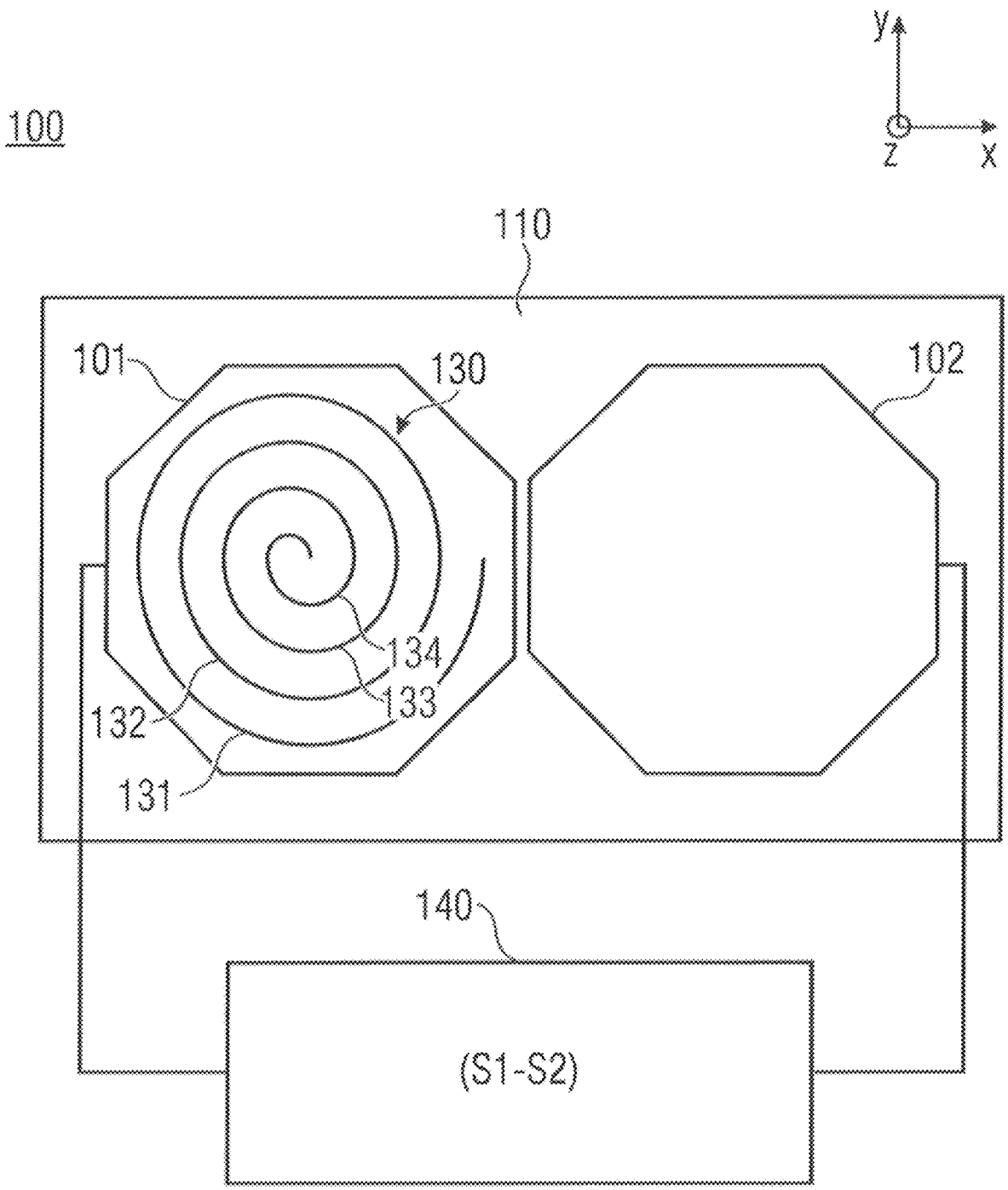
FIG. 1A shows a schematic plan view of a sensor chip according to one example implementation.
Figure 1B:
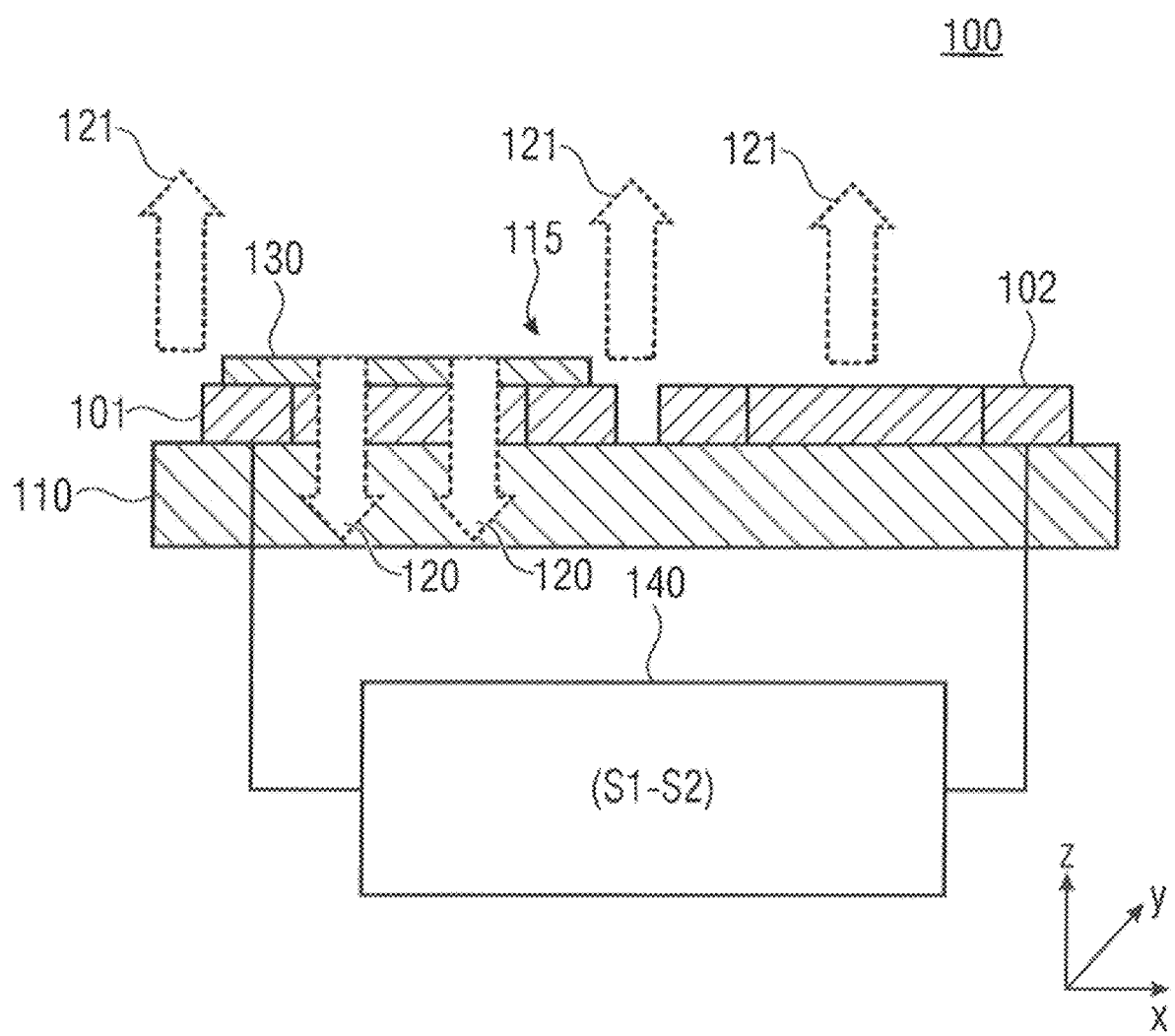
FIG. 1B shows a schematic side view of the sensor chip from FIG. 1A.

FIGS. 1A and 1B show a plan view and a side cross-sectional view of a sensor chip 100 according to the innovative concept described herein. The sensor chip 100 may have a chip substrate 110. The chip substrate 110 may have two magnetic field sensors 101, 102 arranged on it.

The magnetic field sensors 101, 102 are magnetic field sensors that measure perpendicularly to the chip plane, e.g. each of the two magnetic field sensors 101, 102 is configured to measure magnetic field components 120, 121 that are directed perpendicularly to the chip plane. In FIG. 1A, these would be magnetic field components that are directed into the plane of the drawing and out from the plane of the drawing. In FIG. 1B, they would be magnetic field components 120, 121 that are directed from top to bottom and from bottom to top. In both cases, this would correspond to the z direction according to the coordinate system shown in each of the two figures. The two magnetic field sensors 101, 102 may therefore also be referred to as z magnetic field sensors. They may be Z-xMR sensors, MagFETs or Hall sensors, for example.

The two z magnetic field sensors 101, 102 are arranged adjacently to one another on the sensor chip 100 or on the chip substrate 110. At least one of the magnetic field sensors 101, 102 has a planar coil 130 arranged on it. The planar coil 130 covers the respective magnetic field sensor 101, 102 on which it is arranged (e.g. the first magnetic field sensor 101), whereas the coil 130 does not cover the respective adjacent other magnetic field sensor 101, 102 (e.g. the second magnetic field sensor 102). That is to say that the coil 130 covers only the magnetic field sensor 101, 102 on which the coil 130 is arranged.

The planar coil 130 may have multiple turns 131, 132, 133, 134. According to one example implementation, the coil 130 may have at least four turns 131, 132, 133, 134. Four turns provide a sufficiently strong magnetic field 120, 121 to be able to ignore an undesirable magnetic field from the connecting wires, etc., during the measurement. In the center of the coil 130, a section or subregion may remain free, e.g. there may be no turn provided in the center of the coil 130.

Additionally, at least 90% of the turns 131, 132, 133, 134 of the planar coil 130 may be arranged inside the outer contour of the magnetic field sensor 101. In some example implementations, the turns 131, 132, 133, 134 of the coil 130 may be arranged completely or entirely inside the outer contour of the magnetic field sensor 101, as shown by way of example in FIG. 1A. That is to say that, viewed in a plan view of the chip plane or of the chip substrate 110, the whole coil 130 may be situated inside the outer contours of the magnetic field sensor 101. This is a difference over the prior art, in which coils are placed around the outside of z magnetic field sensors.

The coil 130 may thus enclose the magnetic field sensor 101 completely, but also not completely, e.g. the coil 130 may (viewed in the lateral direction) not protrude beyond the outer edge or the circumference of the magnetic field sensor 101. Its outermost turns 131 may run inside, and approximately along the circumference of, the magnetic field sensor 101. The remaining inner turns 132, 133, 134 of the coil 130 may run directly on or over the magnetic field sensor 101, and they may cover the majority (e.g. over 50%) of the magnetic field sensor 101.

As may be seen in FIG. 1B, the planar coil 130 is configured to generate a magnetic field 120, 121 that is directed perpendicularly to the chip plane (e.g. in the z direction). For this, the sensor chip 100 may have a controller 140 that is configured to operate the magnetic field sensors 101, 102 in a calibration mode, in which an input signal is applied to the planar coil 130, as a result of which the coil 130 generates the magnetic field 120, 121 directed in the z direction. The controller 140 may have a circuit or logic. The controller 140 may also be a hardwired interconnection, however.

In the region inside the planar coil 130, e.g. inside the lateral circumference or inside the outer contour of the planar coil 130, the coil 130 generates magnetic field components 120 that are directed in a first z direction (e.g. downward, e.g. in the direction of the chip substrate 110). That is to say that the magnetic field components 120 are directed perpendicularly to the chip plane in which the sensor chip 100 or the chip substrate 110 extends.

In the region outside the planar coil 130, e.g. outside the lateral circumference or outside the outer contour of the planar coil 130, the coil 130 generates magnetic field components 121 that are directed in an opposite second z direction (e.g. upward, e.g. in the direction away from the chip substrate 110). That is to say that the magnetic field components 121 are directed perpendicularly to the chip plane in which the sensor chip 100 or the chip substrate 110 extends, but exactly oppositely to the magnetic field components 120 inside the circumference of the planar coil 130. The magnetic field directions 120, 121 shown purely by way of example in FIG. 1B may also be the other way around, or may alternate over time. Additionally, the length of the arrows shown also does not necessarily indicate a measure of the magnitude or strength of the respective magnetic field component.

The coil 130 thus generates, inside and outside its circumference, a respective magnetic field 120, 121 with opposite polarity or magnetic field direction. The two z magnetic field sensors 101, 102 are configured to detect these very magnetic field components 120, 121 directed perpendicularly to the chip plane (e.g. in the z direction).

If the coil 130 is now arranged on the magnetic field sensor 101, and if the magnetic field sensor 101 and the coil 130 have approximately the same outer dimensions, then the pattern of the magnetic field components 120, 121 that is shown by way of example in FIG. 1B is obtained. That is to say that, inside the circumference of the coil 130, and therefore in the region of the first z magnetic field sensor 101, the coil 130 generates a magnetic field component 120 that is directed in a first z direction perpendicularly to the chip plane. Outside the circumference of the coil 130, and therefore in the region of the second z magnetic field sensor 102, the coil 130 generates a further magnetic field component 121, which is directed in an opposite second z direction perpendicularly to the chip plane, however. Oppositely oriented magnetic field components 120, 121 therefore act on each of the two z magnetic field sensors 101, 102 arranged beside one another.

The controller 140 may be configured so as, in the calibration mode, to ascertain from each of the two magnetic field sensors 101, 102 a response signal S1, S2 in response to the measured magnetic field 120, 121 (Bz1, Bz2). The first magnetic field sensor 101, which measures the magnetic field component 120 (Bz1) directed in the first z direction, may provide a first response signal S1. The second magnetic field sensor 102, which measures the magnetic field component 121 (Bz2) directed in the opposite second z direction, may provide a second response signal S2. The response signals S1, S2 may contain information about the magnitude and/or direction of the magnetic field, for example.

Changes in the respective magnetic field, subsequently denoted by dBz1 (delta Bz1) and dBz2 (delta Bz2) result in the respective response signals S1, S2 changing too, this change subsequently being denoted by dS1 (delta S1) and dS2 (delta S2). That is to say that, if for example the magnetic field Bz1 on the first magnetic field sensor 101 changes from Bz1 to Bz1+dBz1, the response signal from the first magnetic field sensor 101 accordingly also changes from S1 to S1+dS1. If for example the magnetic field Bz2 on the second magnetic field sensor 102 changes from Bz2 to Bz2+dBz2, then the response signal from the second magnetic field sensor 102 accordingly also changes from S2 to S2+dS2.

That is to say that if for example an external (homogeneous) magnetic interference field having the same magnitude Bz now acts on both magnetic field sensors 101, 102, and the interference field changes by dBz, then the response signals S1, S2 from the two magnetic field sensors 101, 102 accordingly also change as appropriate in the calibration mode, and so it holds that: dS1=dS2. It therefore generally holds that:

$$dS1/dBz = dS2/dBz.$$

The controller 140 may now be configured for example so as, in the calibration mode, to combine the two response signals S1, S2 to form a total response signal $S_{ges}$=S1−S2 (e.g. differentially). Based on the change in the total response signal, subsequently denoted by $dS_{ges}$ (delta $S_{ges}$), it therefore holds for the calibration mode that:

$$dS_{ges}/dBz = dS1/dBz - dS2/dBz = 0 \ldots$$

That is to say that the total signal $S_{ges}$ does not change, despite a change in the common (homogeneous) magnetic interference field dBz.

As already mentioned, the coil 130 generates two magnetic field components 120, 121 having different components, e.g. Bz1≠Bz2, and so the change $dS_{ges}$ in the total signal $S_{ges}$ is also not equal to zero, e.g. $dS_{ges}$≠0. In the preferred case, the coil 130 generates magnetic field components 120, 121 having the same magnitude, e.g. Bz1=−Bz2. For the changes in the magnetic fields discussed above, this means: dBz1=−dBz2, and so it holds for the total signal $S_{ges}$ that:

$$dS_{ges} = dS1 - dS2 = (dS1/dBz) * dBz1 - (dS2/dBz) * dBz2 =$$
$$(dS1/dBz) * dBz1 - (dS2/dBz) * (-dBz1) = 2 * (dS1/dBz) * dBz1$$

From this, it is evident that the total signal $S_{ges}$ thus changes to twice the extent of the respective individual signal S1, S2 from a respective magnetic field sensor 101, 102 as soon as the coil 130 generates a magnetic field.

For the purpose of calibrating the magnetic field sensors 101, 102, the controller 140 may thus take a differential measurement involving the response signal S1, S2 from one magnetic field sensor 101, 102 being subtracted from the response signal S1, S2 from the other magnetic field sensor 101, 102, e.g. S1~S2 or S2~S1. This allows stray field robustness toward homogeneous external stray fields to be achieved.

As may be seen in FIGS. 1A and 1B, the planar coil 130 may be arranged on an area 115 of the magnetic field sensor 101 that is opposite the sensor chip 100 or the chip substrate 110. That is to say that the planar coil 130 may be arranged e.g. on top of the magnetic field sensor 101.

Alternatively or additionally, at least the outermost turn 131 of the planar coil 130 may run parallel to the outer contour of the magnetic field sensor 101 and therefore have approximately the same geometric shape as the outer contour of the magnetic field sensor 101. In the example shown in FIG. 1A, the magnetic field sensor 101 has an octagonal outer contour. According to the conceivable example implementation just mentioned, at least the outermost turn 131 of the planar coil 130 could likewise have an octagonal shape (not shown in FIG. 1A) in this case. It would also be conceivable for the whole coil 130 to have the same geometric shape as the magnetic field sensor 101 or the outer contours thereof.

Figure 2:
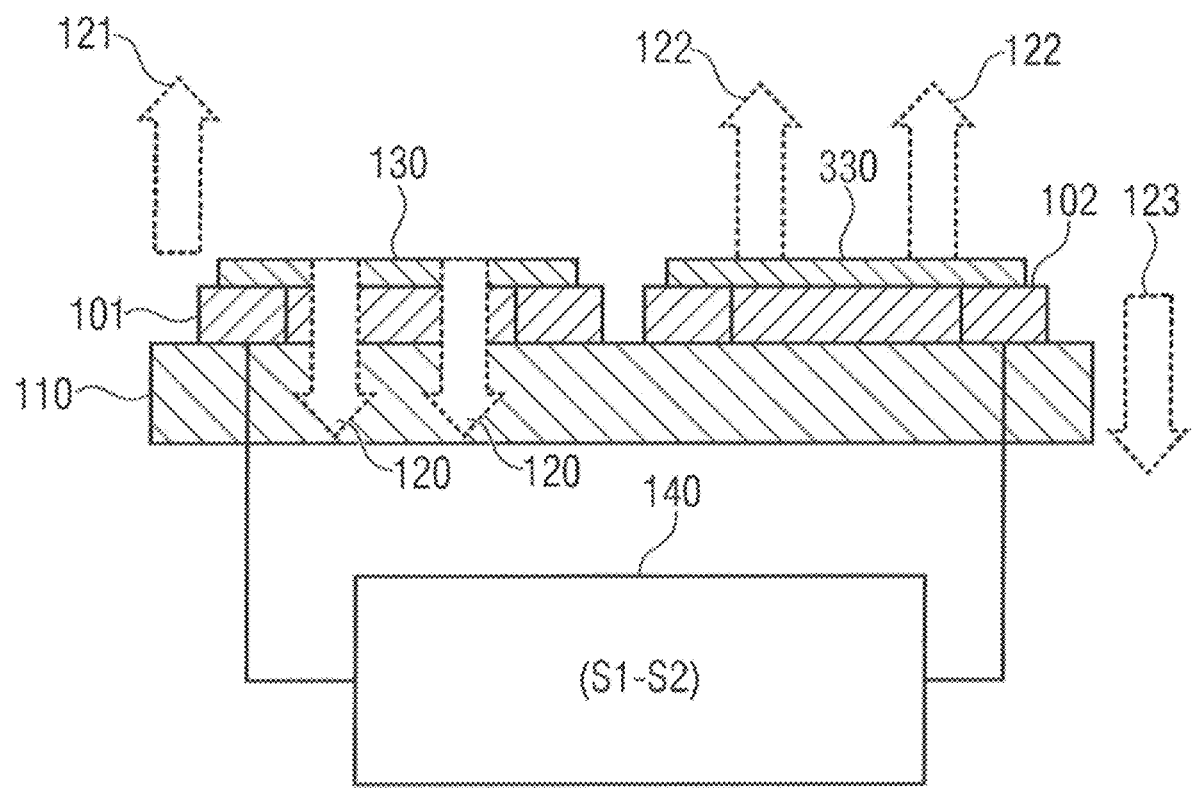
FIG. 2 shows a schematic side view of a sensor chip according to one example implementation.

According to other conceivable example implementations, each of the magnetic field sensors 101, 102 present may have a respective dedicated planar coil 130, 330 arranged on it. FIG. 2 shows an example implementation in which the second magnetic field sensor 102 also has a dedicated coil 330. In principle, there may also be more than the two magnetic field sensors 101, 102 depicted purely by way of example here. In such a case too, it would be conceivable for at least every second magnetic field sensor to have a respective dedicated planar coil, or else for every magnetic field sensor to have a respective dedicated planar coil. Regardless of the number of magnetic field sensors on the sensor chip 100, each magnetic field sensor may thus have its own coil that is arranged on or above the respective magnetic field sensor.

In the example implementation depicted in FIG. 2, it may be seen that the first coil 130, which is arranged on the first magnetic field sensor 101, generates a magnetic field, the magnetic field components 120 of which are directed in a first z direction inside the coil circumference, and therefore in the region of the first magnetic field sensor 101, and the magnetic field components 121 of which are directed in an opposite second z direction outside the coil circumference, and therefore outside the first magnetic field sensor 101.

The second coil 330, which is arranged on the second magnetic field sensor 102, is operated in the opposite sense, that is to say that the second coil 330 generates a magnetic field, the magnetic field components 122 of which are directed in a first z direction inside the coil circumference, and therefore in the region of the second magnetic field sensor 102, and the magnetic field components 123 of which are directed in an opposite second z direction outside the coil circumference, and therefore outside the second magnetic field sensor 102.

The magnetic field components 120 running in the first z direction of the first coil 130 are oppositely directed to the magnetic field components 122 running in the first z direction of the second coil 330. In other words, the magnetic field components 120 generated inside the coil circumference of the first coil 130, and therefore in the region of the first magnetic field sensor 101, are oppositely directed to the magnetic field components 122 generated inside the coil circumference of the second coil 330, and therefore in the region of the second magnetic field sensor 102.

Accordingly, the controller 140 may be configured to operate the planar coils 130, 330 of two adjacent magnetic field sensors 101, 102 in such a way that they generate oppositely directed magnetic fields 120, 122. That is to say that the two coils 130, 330 may be operated by the controller 140 or interconnection (hardwired) in such a way that they generate magnetic fields 120, 122 of different polarity on both magnetic field sensors 101, 102.

As was shown by way of illustration in FIG. 1A, the coils 130 may be of spiral design. In this case, the coil 130 may have a first spiral winding, which runs from the outside (from the outer circumference of the coil 130) to the inside (to the center of the coil 130), and a second spiral winding, which runs from the inside back to the outside. This facilitates contact-connection for the coil 130, since the applicable connections may be routed to the outside and contact-connected there.

Each coil 130 thus has, so to speak, a spiral winding pair having two spiral windings each, one of the two spiral windings winding from the outside to the inside and the other spiral winding back from the inside to the outside. The two individual spiral windings may be connected both mechanically and electrically in series. Preferably, the respective innermost turns 134 (FIG. 1A) of the respective spiral windings may be connected to one another. This affords the advantage that when moving along the individual turns 131, . . . , 134 one spiral winding winds from the outside to the inside and the other spiral winding winds from the inside to the outside—but both in the same sense of rotation around the center.

It is important to mention in this case that the two spiral windings are both wound in the same direction, e.g. they have the same spiral direction or direction of rotation. By way of example, the first spiral winding may run clockwise from the outside to the inside, a change then being made on the inside to the second spiral winding, and the second spiral winding then runs, likewise clockwise, back from the inside to the outside. This would naturally also be conceivable anticlockwise for both spiral windings.

Figure 3:
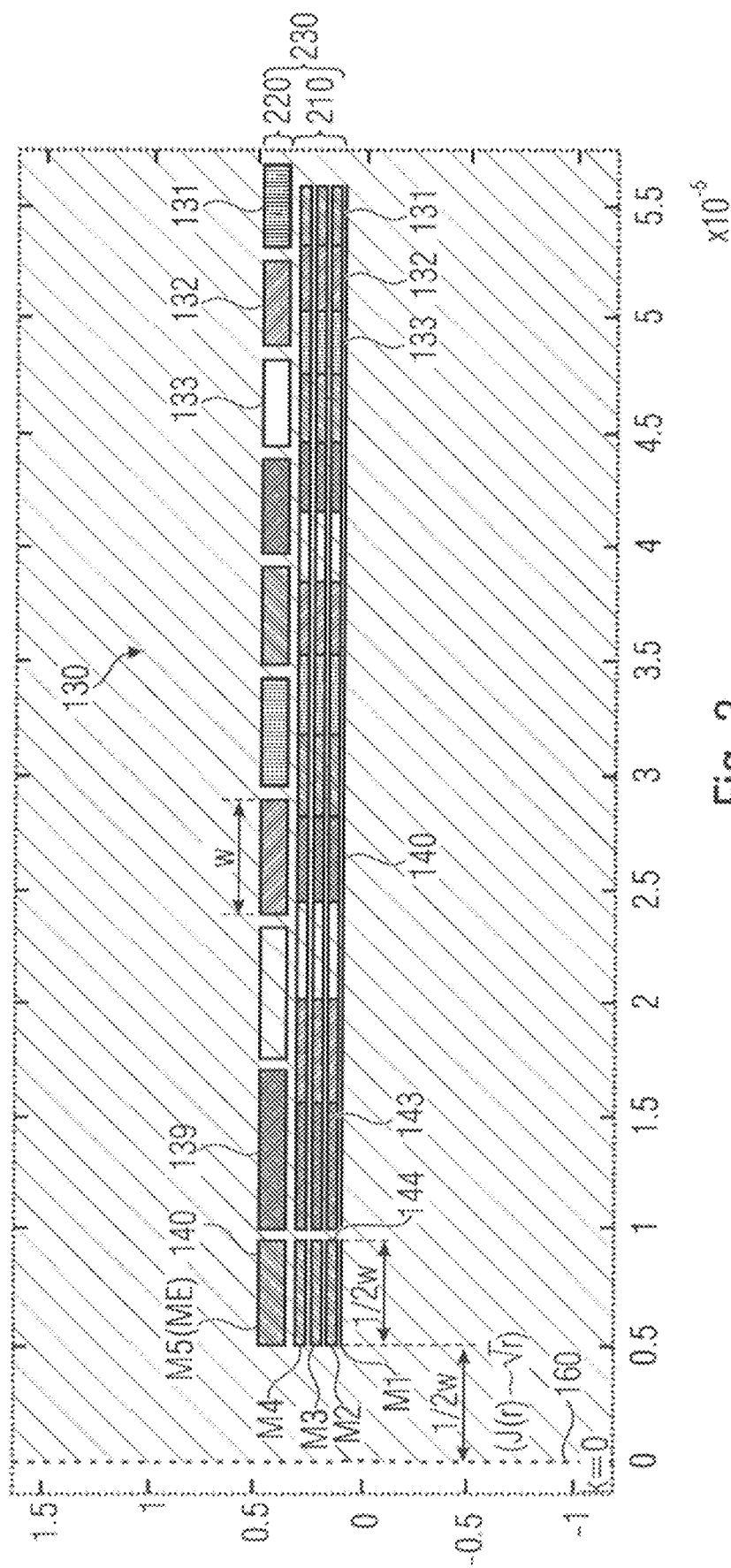
FIG. 3 shows a schematic cross-sectional view of the right-hand half of a spiral winding pair having a single-layer spiral winding and a multilayer spiral winding.

FIG. 3 shows a schematic cross section through a coil 130 according to one example implementation. This coil 130 is of spiral design and has multiple metallization layers M1, . . . , M5 arranged above one another, which may likewise each be of spiral design and which, in combination with one another, form the spiral coil 130.

Specifically, FIG. 3 shows the right-hand portion of a coil 130. Situated at the origin 160 of the coordinate system shown here is the geometric center of the coil 130. Starting from the origin 160 rightwards, the spiral metallization layers M1, . . . , M5 extending or winding radially outwards are then shown.

The nonlimiting example implementation shown in FIG. 3 shows, purely by way of example, a total of five metallization layers M1, M2, M3, M4, M5 layered above one another. These metallization layers may be generated or applied and structured during a micro-structuring method.

This allows the coils 130 to be manufactured at low production cost, and the coils 130 to be positioned very exactly and with high precision. It is often important to arrange the coils 130 as exactly symmetrically as possible with respect to the magnetic field sensors 101, 102, so that the magnetic field sensors 101, 102 see a field of equal strength, but with different polarity, and so that the magnetic field sensors 101, 102 are also heated by the coils 130 to the same extent and with equal inhomogeneity. This applies in particular to angle sensors, where it is desirable to calibrate the individual magnetic field sensors 101, 102 in such a way that they have as identical a magnetic sensitivity as possible (good matching of the sensor characteristics).

As was mentioned at the outset, the planar coil 130 has a spiral winding pair 230 having two spiral windings 210, 220. In the example implementation shown here, the first or upper spiral winding 220 is a single-layer spiral winding. As the name suggests, this upper single-layer spiral winding 220 has a single layer or metallization layer, in this case the upper metallization layer M5. The second or lower spiral winding 210 is a multilayer spiral winding. As the name suggests, this multilayer spiral winding 210 has two or more layers or metallization layers. In the present nonlimiting example implementation, the multilayer spiral winding 210 has four metallization layers M1, M2, M3 and M4, which are layered above one another.

Each spiral winding 210, 220 may have multiple turns 131, 132, . . . , 140. In the example implementation depicted purely by way of example in FIG. 3, the single metallization layer M5 of the single-layer spiral winding 220 has for example ten turns 131, 132, . . . , 140, and the metallization layers M1, M2, M3, M4 of the multilayer spiral winding 210 each have fourteen turns 131, 132, . . . , 144. The spiral windings 210, 220 may have the same or a different number of turns. In a multilayer spiral winding 210, the metallization layers M1, M2, M3, M4 contained therein may each have the same number of turns.

According to example implementations, at least one of the two spiral windings 210, 220 may have at least four turns. As a result, the coil 130 generates a sufficiently strong magnetic field for the inaccurate and poorly defined fields from connecting lines to be able to be ignored.

The individual metallization layers M1, M2, M3, M4 of the multilayer spiral winding 210 may be connected to one another by means of vertical plated-through holes, this being shown using different colors or shadings. This corresponds to a parallel connection of the respective interconnected metallization layers M1, M2, M3, M4. By way of example, the individual superposed turns 131, . . . , 140 of the respective metallization layers M1, M2, M3, M4 of the multilayer spiral winding 210 may be connected to one another by means of vertical plated-through holes.

A parallel connection of metal tracks or metallization layers should be distinguished from parallel connections of components, however. Components (e.g. resistors) have connections and these are interconnected during parallel connection, with the result that the current is distributed to multiple parallel paths. In the case of lines or metallization layers, on the other hand, the two starts thereof may be connected and also the two ends thereof—but it is also possible to make connections in the middle, which is advantageous according to the innovative concept described herein because it increases the metal filling level.

For the aforementioned parallel connection of the individual metallization layers M1, M2, M3, M4 of the multilayer spiral winding 210, two different possibilities would thus be conceivable in principle: (i) the radially inner end of the multilayer spiral winding 210 and the radially outer end of the multilayer spiral winding 210 may be connected, or (ii) the individual metallization layers M1, M2, M3, M4 of the multilayer spiral winding 210 may be connected in parallel by means of a multiplicity of plated-through holes (vias) and connected to one another over their entire length.

This is better, because the plated-through holes enlarge the cross section of the conductor or of the respective metallization layers and reduce the resistance thereof.

The parallel connection of the individual metallization layers M1, M2, M3, M4 of the multilayer spiral winding 210 may thus be achieved by means of vertical plated-through holes (vias). According to example implementations, the interconnected metallization layers M1, M2, M3, M4 may have vertical plated-through holes over more than 30% of their entire length in this case.

The five metallization layers M1, . . . , M5 mentioned in this nonlimiting example implementation are naturally just one example of single-layer or multilayer spiral windings— there are processes with fewer and with more planes or metallization layers (e.g. three to approximately ten metallization layers). It is also usually necessary in practice to use at least one plane or metallization layer for the contact-connection of the sensor: in that case, M1 is usually eliminated from the winding in the (radial) outer region of the sensor where the contacts are located, e.g. a spiral winding 210, 220 may possibly have fewer metallization layers in the outermost turn. The number of turns therefore does not change—only the outermost turn of the lower metal plane M1 is eliminated, and so the outermost turn of the remaining metal layers M2, M3, M4 has a little more resistance.

Besides the implementation described purely by way of illustration here, it may also be conceivable for the positions of the single-layer spiral winding 220 and the multilayer spiral winding 210 to be interchanged. Additionally, it may be conceivable for the spiral winding pair 230 to have two single-layer spiral windings or two multilayer spiral windings. In most semiconductor processes, the topmost metal layer M5 is much thicker than the others; often, it is as thick as the sum of the thicknesses of all the other metal layers M1, . . . , M4. It is advisable to combine the metal layers to form two single/multilayer spiral windings in such a way that the total thicknesses of the two spiral windings are as identical as possible, so that they heat uniformly in the calibration mode given identical line widths.

Example implementations of the present concept may provide for the respective innermost turns 140, 144 of the two spiral windings 210, 220 of the spiral winding pair 230 to be connected to one another in all cases. They may be connected to one another as a series connection. The innermost turns 140, 144 are intended to be understood to mean the turns that are situated closest to the origin 160 or to the geometric center of the coil 130, e.g. the radially innermost turns 140, 144.

The coil 130 may thus have an even number of spiral windings 210, 220, which may be configured as single-layer or multilayer spiral windings. Two spiral windings 210, 220 form a spiral winding pair 230 in this case. The coil 130 may also have more than the one spiral winding pair 230 described purely by way of example.

Each spiral winding pair 230 may have an inwardly directed spiral winding 210 and an outwardly directed spiral winding 220. At least one inwardly directed spiral winding 210 may be connected in series with an outwardly directed spiral winding 220. It is therefore possible to have the current flow from the outer circumference of the magnetic field sensor 101 to the center and back again. If more than two spiral windings 210, 220 should be present, all or some of these may also be connected in parallel or in series.

As may also be seen in FIG. 3, the metallization layers M1, M2, M3, M4, M5 may have different layer thicknesses. By way of example, the topmost metallization layer M5 may have a layer thickness that is greater than the layer thickness of an individual underlying metallization layer M1, M2, M3, M4. In some example implementations, the topmost metallization layer M5 may have a layer thickness that is approximately equal to the layer thicknesses of all the underlying metallization layers M1, M2, M3, M4 together. In microstructuring technology, such an upper metallization layer M5 is also referred to as metal extra, which is why the upper layer M5 is occasionally also shortened to ME in this disclosure.

In most processes in semiconductor production, the topmost metal layer ME is the thickest. However, its great layer thickness means that it also requires the greatest lateral distances between adjacent turns 131, ..., 140. The interspaces between the turns 131, ..., 140 reduce the packing density of the coil 130, as a result of which the efficiency of the coil 130 falls. The efficiency of a coil will be defined here as the strength of the response signal from the magnetic field sensor in proportion to the temperature increase of the magnetic field sensor.

For a coil 130 having a constant turn width of e.g. 0.64 μm and an interspace of 0.64 μm, the packing density is 50% (=0.64/(0.64+0.64)). In practice, the packing density should be at least 70%, or better still at least 80%—e.g. turns having a width of 4*0.64 μm and a distance of 0.64 μm between them. The requisite minimum interspaces (defined in the layout specification of the process) between two adjacent turns 131, ..., 140 therefore define the minimum turn width that may be used for the design of coils 130 comprising metal layers M1, M2, M3, M4, M5: w_min/(w_min+min-gap)>0.8.

The layer thickness of the metallization layers M1, M2, M3, M4, M5 of the two spiral windings 210, 220 may, according to example implementations, be chosen such that the mean or averaged power density or current density J in the two spiral windings 210, 200 or in all M1, M2, M3, M4, M5 is equal.

Figure 4B:
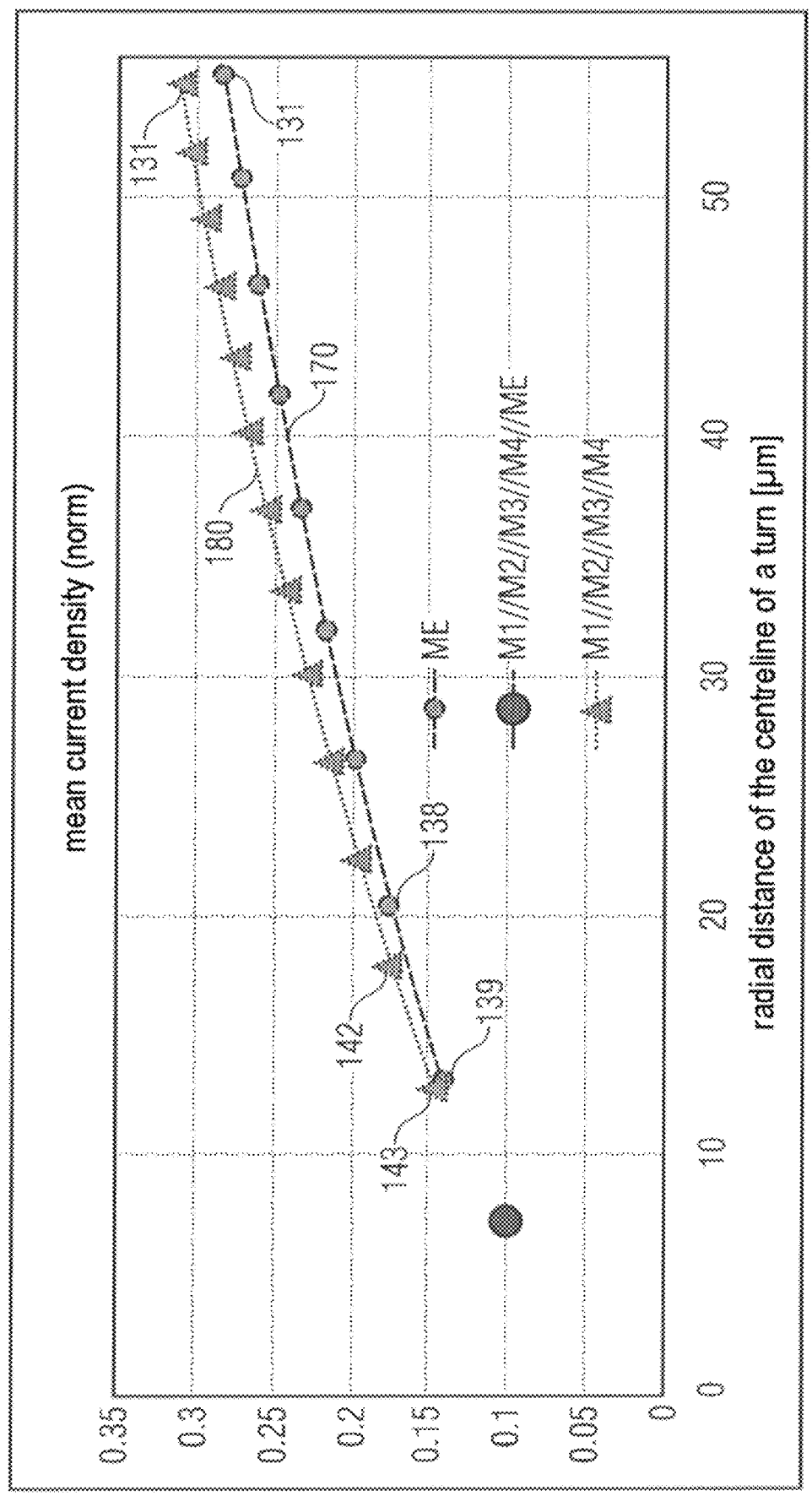
FIG. 4B shows a schematic view of the mean current-density distribution J(r) in the individual turns of a spiral winding, which increases with radial distance according to $J(r) \sim \sqrt{r}$.

This will be explained in more detail below with reference to FIGS. 4A and 4B. FIG. 4A shows the exact current-density distribution in the individual turns 131, ..., 144 of the metallization layers M1, M2, M3, M4 of the multilayer spiral winding 210 (FIG. 3) and also the current-density distribution in the individual turns 131, ..., 140 of the individual metallization layer M5 of the single-layer spiral winding 220. The x-axis plots the radial distance r of the reference point to the center of the spiral coil.

FIG. 4B depicts the mean current density J (y-axis) in the respective turns based on the radial distance (x-axis) of the respective turn from the center or origin 160.

The mean power density or current density J just mentioned is the power density averaged over a single turn 131, ..., 144. This is because the power density within a single turn 131, ..., 144 is not exactly homogeneous, but rather increases towards the inner circumference 150 of a single turn. In this case, it should be stated that within a turn the current-density distribution is hyperbolic (~1/r), with an increased current density at the inner circumference 150. That is to say that the power density or current density J is less at the radially outer edge 151 of a single turn than at the radially inner edge 150 of the respective turn, which is closer to the center 160.

Occasionally, it is only of interest how great the power loss within a turn is overall, without the actual spatial distribution of the current density within this turn being of interest—in this case, a mean value of the current density may be determined, which may then in turn be referred to as the mean power density.

The following example will be used for this. It is assumed that the five metallization layers previously described by way of example with reference to FIG. 3 are available for the coil 130: M1, M2, M3, M4, M5. The individual layers or metallization layers M1, M2, M3, M4, M5 could each have layer resistances of 71 mΩ, 60 mΩ, 60 mΩ, 60 mΩ and 19 mΩ in this example (e.g. all layers or metallization layers M1, M2, M3, M4, M5 may consist of the same material, M1 being able to be thinner than M2, M3 and M4, and the topmost metal layer M5 in turn being able to be much thicker than M1, M2, M3 and M4).

It is assumed that M5 is used for the inwardly directed spiral winding 220, and all other layers or metallization layers M1, M2, M3 and M4 are used for the outwardly directed spiral winding 210, with M1, M2, M3 and M4 being connected up in parallel. This parallel connection of M1, M2, M3 and M4 would then have a lower layer thickness than M5, specifically only 0.82 times that of M5.

Therefore, implementations of the innovative concept described herein provide for a single turn in the layers or metallization layers M1, M2, M3 and M4 to require a smaller width than a single turn in M5, specifically just 82% of the width of M5. If the two spiral windings 210, 220 are connected in series, the same current flows through the spiral windings 210, 220, and since the first spiral winding 210 (M1, M2, M3, M4) is thicker overall than the second spiral winding 220 (M5), specifically by the factor 1/0.82, narrower wires may be chosen for each of the individual turns of the respective layers or metallization layers M1, M2, M3 and M4 than for the turns in the metallization layer M5, namely by the factor 0.82 narrower than M5, so that the same power density and the same heating is obtained in both spiral windings 210, 220.

That is to say that if the layer thickness of one spiral winding, e.g. the multilayer spiral winding 210, is greater by a factor x than the layer thickness of the other spiral winding, e.g. the single-layer spiral winding 220, then the individual turns of the respective thicker spiral winding 210 need to be embodied such that the turns have a lateral extent (radial or lateral turn width) that is less by this very factor x than the lateral turn width of the individual turns of the respective thinner spiral winding 220.

The effect that may be achieved thereby is that the total cross section of the first spiral winding 210 and the total cross section of the second spiral winding 220 are equal. An equal mean current-density distribution is therefore achievable in the two spiral windings 210, 220.

The individual turns of a spiral winding 210, 220 may each have a constant width. Advantageously, however, the width of the individual turns of a spiral winding 210, 220 may decrease with the square root of the radial distance ($\sqrt{r}$=sqrt(r)) from the center of the magnetic field sensor 101 to the outside. In this regard, reference will once again also be made to FIG. 3. Here, it may be seen that the width w of the individual turns of the spiral windings 210, 220 decreases towards the outside.

Advantageously, the mean current density J in the turns of a spiral winding 210, 220 is equal to J(r)~sqrt(r). As for the power, the term "mean" current density is also used for the current density J. This denotes the current divided by the cross section of the turn, even if in reality the current density J close to the inner circumference 150 (FIG. 4A) is simply a little higher than close to the outer circumference 151 of this turn. The actual, e.g. unaveraged, current-density distribution nevertheless comes very close to the ideal sqrt(r) pattern.

As FIG. 4B shows, the current density J in the individual turns 131, ..., 143 should increase slightly towards the outer circumference of the magnetic field sensor 101, since this yields maximum efficiency for the coil 130. The magnetic field is much larger in the lateral center of the magnetic field sensor 101 than at the outer edge of the magnetic field sensor 101 (where the contacts are situated, in particular in the case of Hall plates). The maximum efficiency is thus a combined property of the magnetic field coil 130 and the magnetic field sensor 101. That is to say that, when $J(r) \sim \mathrm{sqrt}(r)$, as large as possible a response signal S1 is obtained given simultaneously least possible heating. In FIG. 4B, the curve 170 represents the mean current density characteristic in the individual turns 131, ..., 139 of the single-layer spiral winding 220, and the curve 180 represents the mean current density characteristic in the individual turns 131, ..., 143 of the multilayer spiral winding 210. The circles and triangles represent the radial position in the center of the respective turn 131, ..., 143.

Figure 4C:
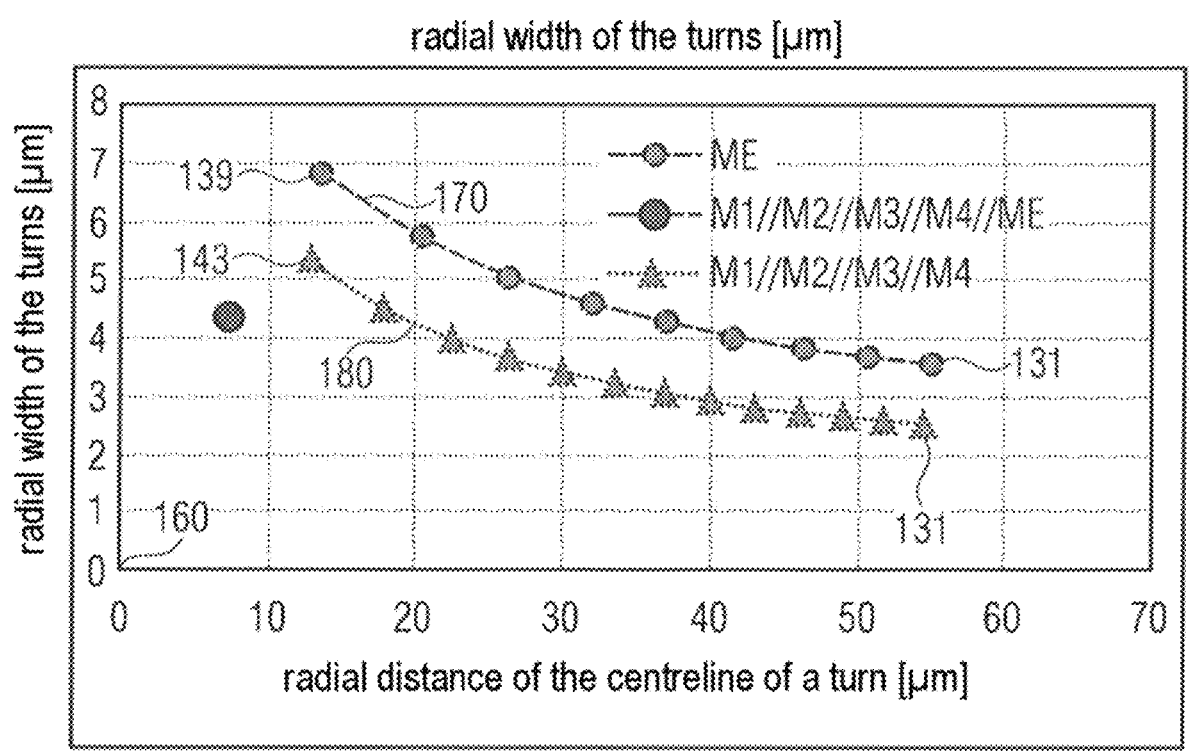
FIG. 4C shows a schematic view of the radial widths of the individual turns of a spiral winding, which decrease with radial distance according to $J(r) \sim \sqrt{r}$.

FIG. 4C shows the radial widths of the respective turns 131, ..., 143 that is needed for this. It may be seen that the individual turns 131, ..., 143 should have an ever greater width the closer they come to the center 160.

Accordingly, example implementations provide for the lateral widths of the individual turns 131, ..., 143 of one spiral winding 210 and the lateral widths of the individual turns 131, ..., 139 of the other spiral winding 220 to be chosen such that a mean current-density distribution in the individual turns 131, ..., 143 of the one spiral winding 210 is equal to a mean current-density distribution in the individual turns 131, ..., 139 of the other spiral winding 220. This is based on turns having the same radial distance, e.g. at the distance of x μm from the center 116 all turns arranged there should have the same mean current-density distribution. A difference in the current-density distributions of ±10% is included in this instance.

It may thus be stated that the individual turns 131, ..., 143 of one spiral winding, e.g. the multilayer spiral winding 210, and/or the individual turns 131, ..., 139 of the other spiral winding, e.g. the single-layer spiral winding 220, may each have different lateral turn widths w that decrease as the radial distance from the spiral center 160 increases.

The decrease in the lateral turn width of the respective individual turns 131, ..., 143 as the radial distance increases should be chosen such that the averaged current-density distribution $J(r)$ in the individual turns 131, ..., 143 changes based on the radial distance r with a proportionality factor $\sqrt{r}$, and so it holds that $J(r) \sim \sqrt{r}$.

That is to say that if the width of the individual turns 131, ..., 143 is chosen as depicted in FIG. 4C, a mean current-density distribution $J(r)$ that increases towards the outside with the proportionality factor $\sqrt{r}$, as shown in FIG. 4B, is established in each of the turns 131, 143.

An optimum current-density distribution $J(r) \sim \mathrm{sqrt}(r)$ may thus be achieved by scaling the width of the turns 131, ..., 143 as appropriate. This applies to slender turns $(r\_o - r\_i) \ll r\_i$, which means that the width of a turn 131, ..., 143 is small in proportion to its inner radius ($r\_i$, $r\_o$ are the inner and outer radii of a turn).

The closer the individual turns 131, ..., 143 get to the center 160, the wider they may thus become. At the same time, however, the inner radius also becomes smaller and smaller. Then, $(r\_o - r\_i)$ is no longer small compared to $r\_i$ and the current density within a turn 131, ..., 143 is then no longer homogeneously distributed. In fact, the current density within a circular turn 131, ..., 143 has a dependency $J(r) \sim 1/r$ (see also FIG. 4A), which is different than the optimum sqrt(r) rule described therein. If, however, the turn 131, ..., 143 is narrow, the 1/r rule is close to a homogeneous current-density distribution. And if the closest turn 131, ..., 143 has a different width, then the global sqrt(r) rule may be applied again.

This is problematic for the innermost turns 140, 144 (e.g. the turns situated closest to the center 160 in the radial direction), however, because they are wide and r_i is small compared to r_o. Then, the 1/r dependency in the inner turns 140, 144 adversely affects the global sqrt(r) rule considerably, which impairs the efficiency of the coil 130.

The best way of solving this problem is to connect the respective innermost turns 140, 144 of the inwardly directed spiral winding 210 and of the outwardly directed spiral winding 220 in parallel with one another. In the example above, this means that the respective innermost turns 140 of the metallization layers M1, M2, M3, M4 of the multilayer spiral winding 210 and the innermost turn 144 of the metallization layer M5 of the single-layer spiral winding 220 are all connected to one another in parallel. This produces a common innermost turn of the coil 130. The thereby increased total thickness of the metal at this innermost turn 140, 144 means that the width of the innermost turn 140, 144 may be decreased and an excessively high current density at the inner circumference of the innermost turn 140, 144 may be avoided.

In this regard, reference will again be made to FIG. 3. Here, it may be seen that the width of the individual turns 131, ..., 139 of the single-layer spiral winding 220 and the width of the individual turns 131, ..., 143 of the multilayer spiral winding 210 increase from the outside to the inside according to the $J(r) \sim \sqrt{r}$ rule described above. The innermost turns 140, 144 of the respective spiral windings 210, 220 are now only half as wide as they would actually need to be in order to continue the $J(r) \sim \sqrt{r}$ rule, however. If the left-hand half of the coil 130 were now also considered, then an area with a diameter d 2*12 w w around the center 160 would thus not be covered with metal. That is to say that, in the radial center 160 of the magnetic field sensor 101, there would be provision for a cutout in the coil 130 that would have a diameter d that corresponds to approximately twice the width (½ w) of the innermost turn 140, 144 of the coil 130, e.g. diameter d W.

Applicable example implementations accordingly provide for the innermost turn 144 of one spiral winding 210, and/or the innermost turn 140 of the other spiral winding 220, to have a lateral width that is merely half as great as a lateral width of an innermost turn that would otherwise satisfy the condition $J(r) \sim \sqrt{r}$, with the result that the respective innermost turn 140, 144 does not reach as far as the spiral center 160 and the corresponding spiral winding 140, 144 therefore has, in the spiral center 160, a cutout whose diameter corresponds to twice the lateral width of the halved innermost turn 140, 144. This applies in particular if (as described above) the respective innermost turns 140, 144 of the two spiral windings 210, 220 are connected up in parallel with one another.

Purely for the sake of clarity, it will be noted at this juncture that the innermost turn of a multilayer spiral winding denotes all innermost turns of all metallization layers of the multilayer spiral winding, that is to say in this example the respective innermost turns 144 of the metallization layers M1, M2, M3, M4.

The problem mentioned at the outset regarding the magnetic interfering fields on the test rig may be solved according to the concept described herein by using at least two z magnetic field sensors 101, 102. Each of these may have a respective dedicated coil 130, 330 (see FIG. 2).

The coils 130, 230 may be connected in parallel or in series, the electrical current being able to flow through the two coils 130, 330 in respective opposite directions—this is referred to as antiparallel or antiseries. These currents generate a positive magnetic field 122 with $BI=C_{coil}*I_{coil}>0$ on the first z magnetic field sensor 101, which generates a corresponding first response signal S1, and a negative magnetic field 122 with $B2=-(C_{coil}*I_{coil})>0$ on the second z magnetic field sensor 102, which generates a corresponding second response signal S2 ($C_{coil}$ is the coil constant "magnetic field per current strength" in T/A).

Switches connect the output connections of the z magnetic field sensors 101, 102 to the signal conditioning circuit (preamplifier) in such a way that the output voltages of the two z magnetic field sensors 101, 102 are subtracted during this calibration process. The response signal $S_{ges}$ from the sensor circuit is therefore proportional to $$S1\sim S2=C_{coil}*I_{coil}-(-C_{coil}*I_{coil})=2*C_{coil}*I_{coil}$$

External magnetic interfering fields are as far as possible homogeneous on the two z magnetic field sensors 101, 102. The subtraction therefore cancels them out. It should additionally be noted that a coil 130, 330 generates a magnetic field having opposite polarity inside and outside its circumference, see the magnetic field components 120, 121 of the first coil 130 and the magnetic field components 122, 123 of the second coil 330 in FIG. 2.

The antiparallel or antiseries connection of the coils 130, 330 therefore adds a portion of the magnetic field from the first coil 130 on the second z magnetic field sensor 102, and a portion of the magnetic field from the second coil 330 on the first z magnetic field sensor 101, which increases the efficiency of the coils 130, 330 (if the two z magnetic field sensors 101, 102 are situated close to one another).

Figure 5:
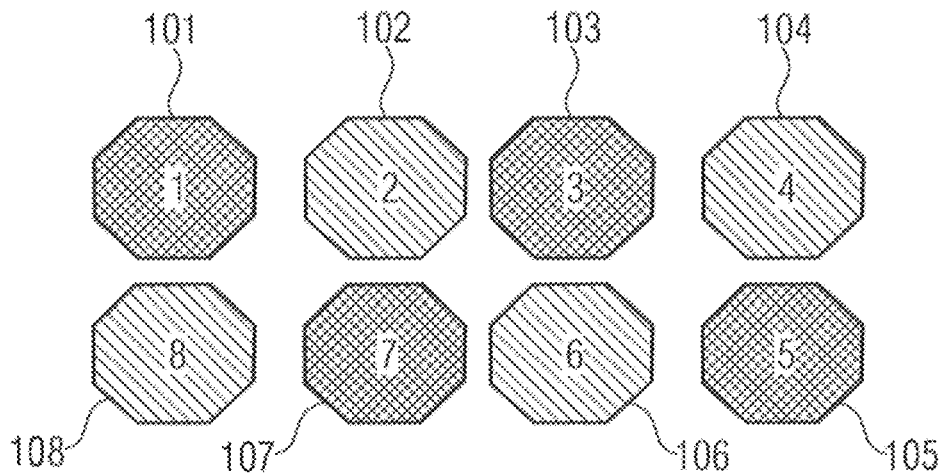
FIG. 5 shows a schematic plan view of groups of z magnetic field sensors that may be actuated in a specific configuration according to one example implementation.

An example of this is shown in FIG. 5. Here, a total of eight z magnetic field sensors 101, 102, . . . , 108 are arranged in two rows with four z magnetic field sensors per row. Each z magnetic field sensor may have a dedicated coil. The polarity of the magnetic field generated by the coils on the eight z magnetic field sensors 101, . . . , 108 has a checkerboard pattern.

That is to say that the z magnetic field sensors 101, . . . , 108 may be divided into two groups. The z magnetic field sensors of a first group (blue), that is to say for example the even-numbered z magnetic field sensors 102, 104, 106, 108, may have coils that generate a negative magnetic field (it points into the plane of the drawing), for example. The z magnetic field sensors of a second group (red), that is to say for example the odd-numbered z magnetic field sensors 101, 103, 105, 107, may have coils that generate a positive magnetic field (it points out from the plane of the drawing).

By way of example, the z magnetic field sensors 103, 105 from one group would then add a portion of the magnetic field to a z magnetic field sensor 104 from the other group, whereas the z magnetic field sensor 106 from the same group as the z magnetic field sensor 104 subtracts a portion of the magnetic field from the z magnetic field sensor 104. Since the z magnetic field sensor 106 from the same group is arranged diagonally with respect to the z magnetic field sensor 104, and therefore is 1.4 times further away than the two z magnetic field sensors 105, 106 from the other group, the closer z magnetic field sensors 103, 105 receive a greater weighting than the more remote z magnetic field sensor 106.

Applicable example implementations of the sensor chip 100 may thus provide for one of the at least two magnetic field sensors 101, 102 measuring perpendicularly to the chip plane to be part of a first magnetic field sensor group (red), and for the other of the at least two magnetic field sensors 101, 102 measuring perpendicularly to the chip plane to be part of a second magnetic field sensor group (blue). Each group may either contain just or exclusively the respective magnetic field sensor 101, 102. Alternatively, each group may have at least one further magnetic field sensor 103, 104.

The magnetic field sensors 101, 103 of the first magnetic field sensor group (red) and the magnetic field sensors 102, 104 of the second magnetic field sensor group (blue) may each have a planar coil (not depicted here) arranged on them that is configured to generate a magnetic field directed perpendicularly to the chip plane.

In this case, the controller may be configured to operate the planar coils of the first magnetic field sensor group (red) and the planar coils of the second magnetic field sensor group (blue) in such a way that they generate oppositely directed magnetic fields.

As mentioned at the outset, the controller 140 may be configured so as, for the purpose of calibrating the magnetic field sensors 101, . . . , 108, to take a differential measurement involving the response signal S1 from the magnetic field sensors 101, 103, 105, 107 of the first magnetic field sensor group (red) being subtracted from the response signal S2 from the magnetic field sensors 102, 104, 106, 108 of the second magnetic field sensor group (blue) (S1-S2). As mentioned at the outset, the respective response signals S1, S2 may contain information about the magnitude and/or direction of the measured magnetic field.

Both z magnetic field sensors 101, 102 or the z magnetic field sensors 101, . . . , 108 of both groups (red, blue) may be connected up differentially (or astatically), with the result that the total signal undergoes no change if a homogeneous interfering field on both z magnetic field sensors 101, 102 or on the z magnetic field sensors 101, . . . , 108 of both groups changes. This may be achieved by way of different measures, e.g. by reversing the polarity of the response signals from the second z magnetic field sensor 102 or from the z magnetic field sensors 102, 104, 106, 108 of the second group, or else just their supply current, or first of all inverting or subtracting, instead of adding, the response signals in the signal processing.

The concept described herein affords the opportunity to improve efficiency during the calibration even further. By way of example, the magnetic field may be applied just to selected z magnetic field sensors, and therefore not to all z magnetic field sensors.

For this, it is possible, by way of example, for the output connections of z magnetic field sensors whose coils are not intended to be actuated to be simply DC-isolated from the preamplifier circuit by means of the controller 140. The powered coils do not need to be in direct proximity to one another either—if the powered coils are arranged at a short distance from one another (approximately at the distance of one to five z sensors), for example, the excess temperature on the z magnetic field sensors with powered coils is significantly reduced.

Figure 6:
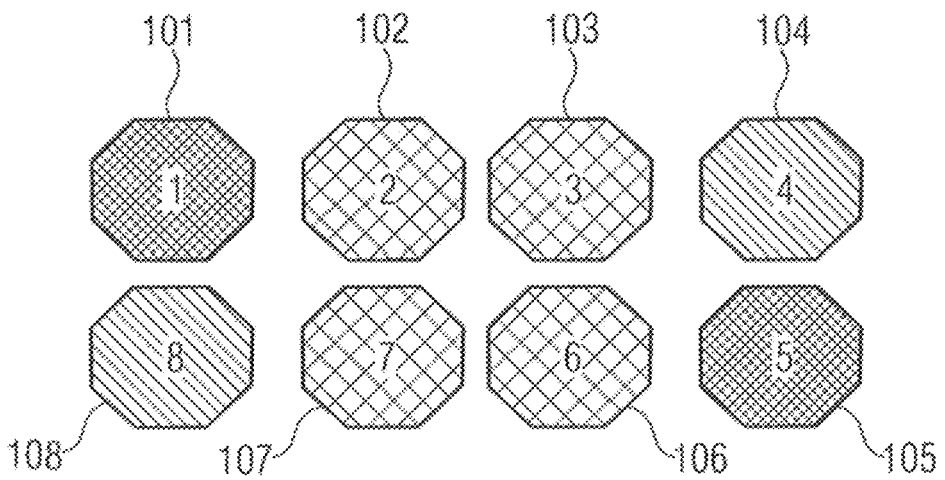
FIG. 6 shows a schematic plan view of groups of z magnetic field sensors that may be actuated in a specific configuration according to another example implementation.

Both example implementations are illustrated in FIG. 6. The controller may be configured to deactivate one or more of the planar coils and/or magnetic field sensors 101, . . . , 108 of the first and/or second magnetic field sensor group (red or blue) during the calibration process by applying no input signal to the respective inactive coils and/or determining no response signal from the respective inactive magnetic field sensors 101, . . . 108. In this case, a group (gray) of inactive coils and/or magnetic field sensors may be physically situated between a group of active coils and magnetic field sensors (red or blue).

In the nonlimiting example implementation with eight z magnetic field sensors 101, . . . , 108 that is shown here, just some of the z magnetic field sensors may thus be active (red, blue) while a second portion (gray) may be inactive. By way of example, just the z magnetic field sensors 101, 104, 105 and 108 may have powered coils that generate a magnetic field, while the z magnetic field sensors 102, 103, 106, 107 are inactive or have inactive coils.

A group of inactive coils and/or inactive magnetic field sensors 102, 103, 106, 107 (gray) is thus physically situated between a group of active coils and active magnetic field sensors 101, 104, 105, 108 (blue, red). By way of example, as shown in FIG. 6, two columns of z magnetic field sensors 102, 107 and 103, 106 may be inactive, and one column of z magnetic field sensors 101, 108 and 104, 105 arranged to the right and one to the left beside it may be active. It would also be conceivable for an active column of z magnetic field sensors to alternate with an inactive column of z magnetic field sensors. The same would be conceivable for rows of z magnetic field sensors.

Inactive z magnetic field sensors 102, 103, 106, 107 experience almost no magnetic field from the coils—they are isolated from the circuit during the calibration process. Normally, all of the z magnetic field sensors have specifications that match one another as far as possible, which is why the total error during calibration may turn out to be low even if some of the z magnetic field sensors are not in operation.

It is assumed that the uncalibrated z magnetic field sensors 102, 103, 106, 107 have 1% less signal per millitesla in total than the calibrated z magnetic field sensors 101, 104, 105, 108. The total calibration error of all the magnetic field sensors is then just 0.5%. Since all of the z magnetic field sensors are arranged very close to one another, and the uncalibrated z magnetic field sensors 102, 103, 106, 107 are situated between the calibrated z magnetic field sensors 101, 104, 105, 108, it appears improbable that the mismatch of the sensitivities between multiple z magnetic field sensors (e.g. between the four z magnetic field sensors 101, 104, 105, 108 and the four z magnetic field sensors 102, 103, 106, 107) is 1% or more.

Figure 7:
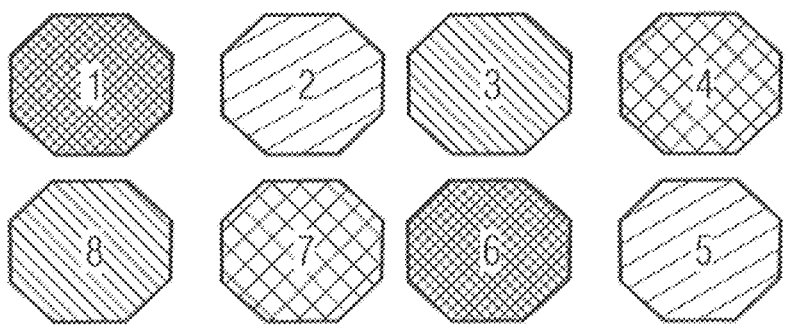
FIG. 7 shows a schematic plan view of groups of z magnetic field sensors that may be actuated in a specific configuration according to another example implementation.

Alternatively, the coils or z magnetic field sensors 101, . . . , 108 may be actuated based on phase. A suitable combination of coils or phase-based actuation of the coils could then appear as shown in FIG. 7.

By way of example, the coils 101, 103, 106 and 108 may be operated in a first phase, while the coils 102, 104, 105 and 107 are operated in a second phase. A respective inactive column is situated between two active columns of coils in order to reduce excess temperatures.

Applicable example implementations accordingly provide for the controller 140 to be configured to activate and deactivate each of the coils and/or magnetic field sensors 101, . . . 108 at alternate times by activating the coils and/or magnetic field sensors that are inactive at a first time at a second time, and deactivating the coils and/or magnetic field sensors that are active at the first time at the second time.

A coil 130 should preferably be connected to ground. As a result, it is used as capacitive shielding during normal operation. If the calibration coil 130 is used during wafer testing, its high-side pad may also be connected to ground in the housing by means of wire bonding. If transient magnetic interfering fields induce currents in the coil 130, the astatic (differential) interconnection of the coils means that the currents are not coupled into the signal path (e.g. during the test the interfering fields generate a field with alternating polarity on the even-numbered or odd-numbered z magnetic field sensors—the currents therefore generate positive and negative fields on the z magnetic field sensors, which cancels out the net effect during normal operation).

Accordingly, it is advantageous if the planar coils 130, 330 (e.g. FIG. 2) used here are connected to ground potential, with there being two cases. The coil 130 may either be hardwired to ground, or it may be grounded using an electronically activable switch. The term "hardwired" may also include a normally-on (depletion) transistor—this requires no electrical signal in order to be on. If a switch is used, this switch should preferably have a switch-on resistance Ron that is less than or no more than the order of magnitude of the coil resistance. Additionally, the coil 130 may, since of course it is above the z sensor 101, form an electrical shield, this shield then being grounded even if the whole circuit is not supplied with electrical power.

Other conceivable example implementations may provide for the individual spiral windings 210, 220 or the individual layers M1, . . . , M5 of the spiral windings 210, 220 to be positioned in such a way that, in plan view, they are "opaque" to the active sensor region within the signal contacts. This means that there are no holes through which an electrical field could reach through to the sensor region from the outside, very small holes being irrelevant.

The spiral coil 130 used according to the concept described herein generates a highly inhomogeneous magnetic field. This will be explained in more detail below with reference to FIGS. 8 and 9.

Figure 8:
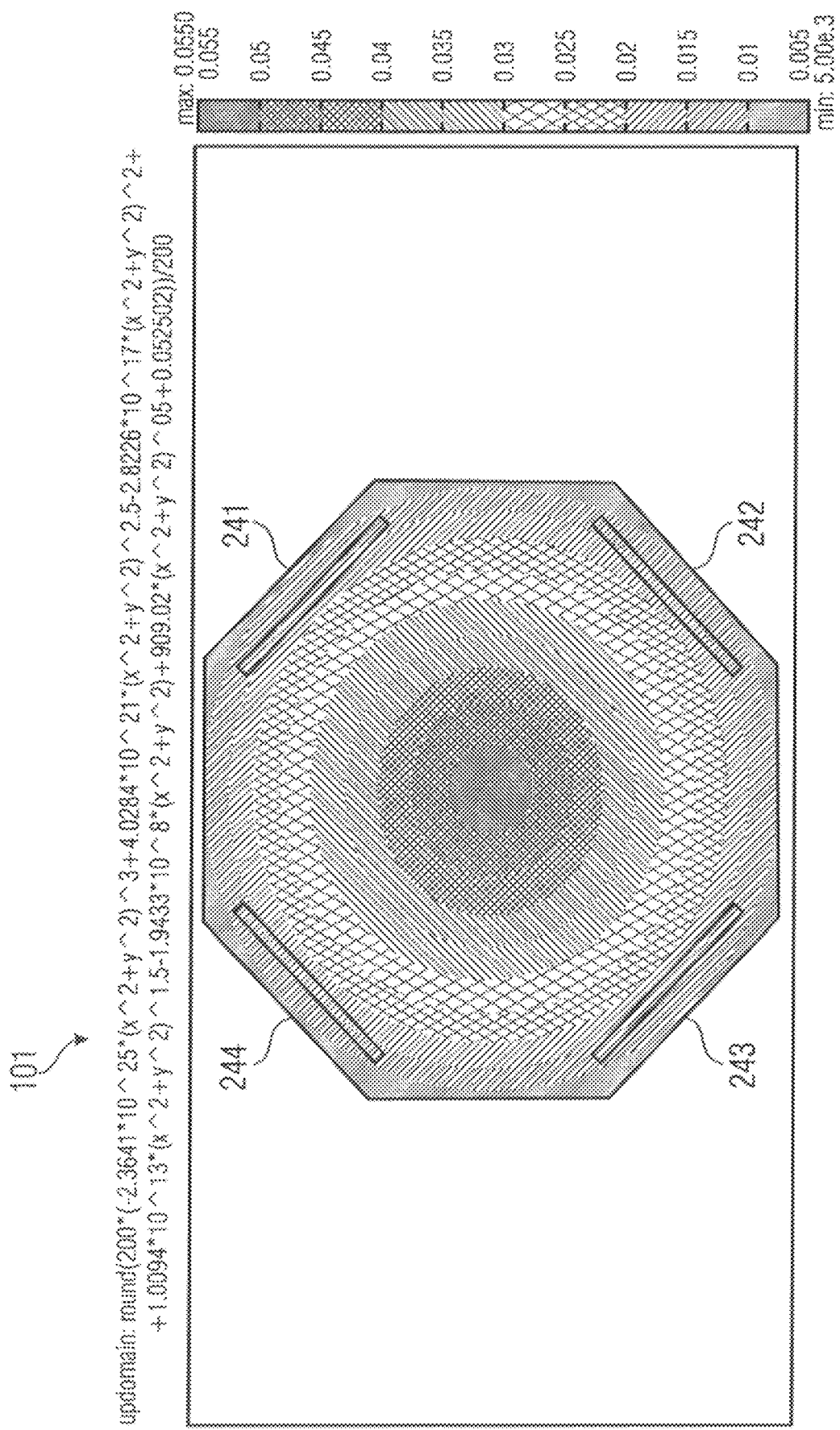
FIG. 8 shows a schematic plan view of a z magnetic field sensor having a coil arranged thereon and a flow density distribution over the sensor.

FIG. 8 shows a plan view of an octagonal Hall plate as a nonlimiting example of a z magnetic field sensor 101. Arranged on the Hall plate 101 is a coil 130 (not depicted) according to the concept described herein. This coil 130 generates an inhomogeneous magnetic field that has the greatest magnetic field strength in the center of the Hall plate 101, the generated magnetic field decreasing radially outwards.

Figure 9:
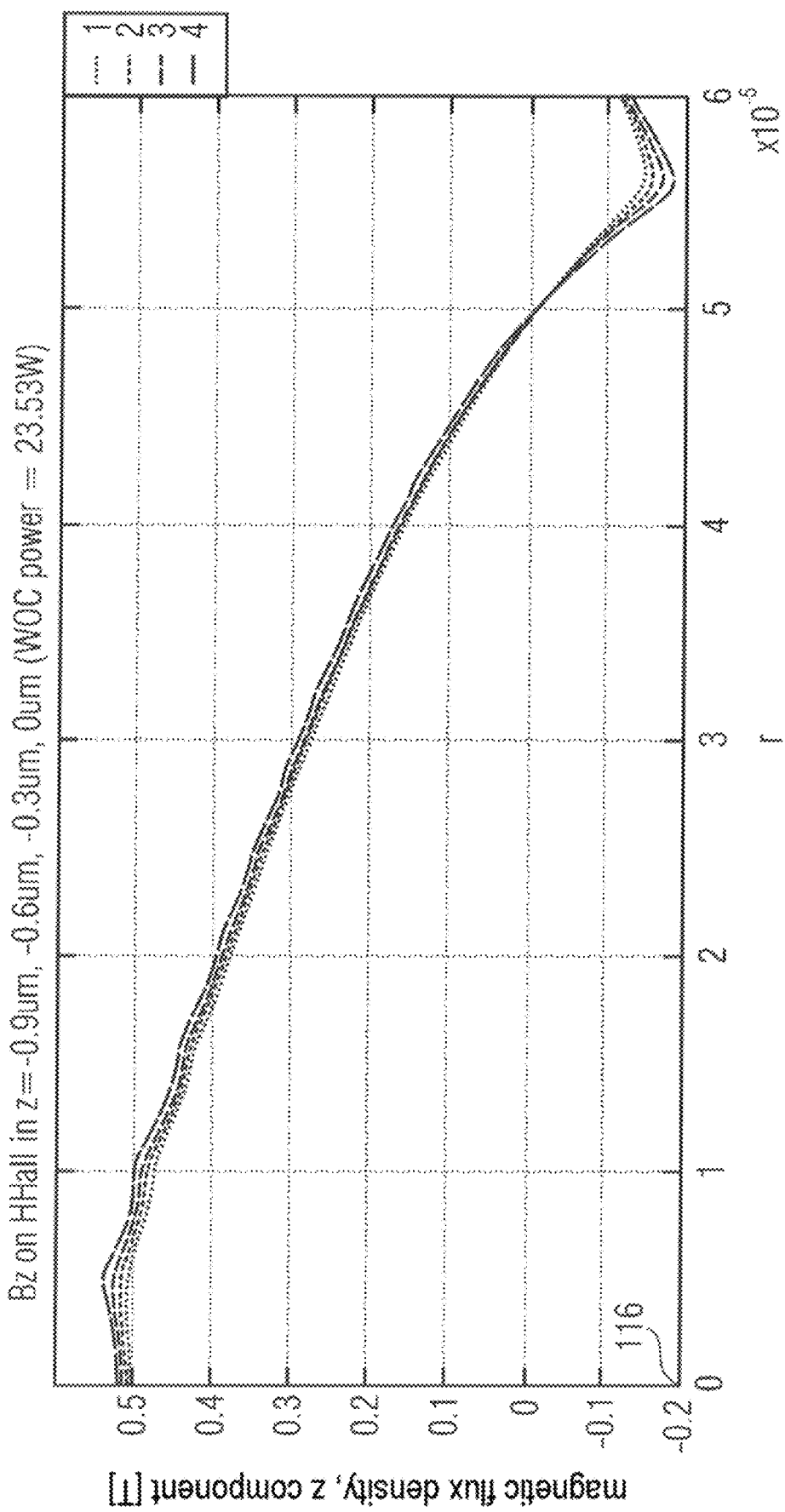
FIG. 9 shows a schematic view of the flow density distribution of the inhomogeneous magnetic field of the coil based on the radial distance from the center of the z sensor.

This is discernible in FIG. 9. Here, the magnetic flux density (y-axis) is shown in relation to the radial distance (x-axis) from the center 116 of the Hall plate. The four curves show the magnetic field in four parallel horizontal planes through the Hall plate at different vertical distances from the coil.

It may be seen that the magnetic flux density is strongest in the center 116 and decreases as the radial distance from the center 116 increases. In this nonlimiting example, the magnetic flux density runs through the zero point at a radial distance of approximately 50 μm from the center 116. This corresponds approximately to the size or outer contour of the Hall plate 101. The magnetic flux density then reverses and becomes negative. That is to say that the coil 130 generates negative magnetic field outside the outer contour of the Hall plate 101.

Hitherto, it has been assumed that homogeneous magnetic fields would need to be generated in order to calibrate z magnetic field sensors. This sometimes involves using large coils, the lateral circumference of which is greater than the circumference of the z magnetic field sensors. The problem here is that these coils have a high power consumption and therefore dissipate a very large amount of unwanted heat that impairs the calibration process.

By contrast, the coil 130 used here as part of this disclosure requires a much lower power consumption and therefore generates much less waste heat. In order to simplify the calculations and to allow a comparison with the conventional homogeneous coils, an equivalent is used for the consideration below.

Specifically, the flux density shown in FIGS. 8 and 9 corresponds to a homogeneous field with 35.4 mT for a power consumption of 0.25 W. With four Hall plates on the sensor chip, this would mean that waste heat is produced with a temperature gradient of 18° C. Components arranged beside the sensor chip at a distance of at least ten Hall plates usually experience a temperature rise of only approximately 2° C. during the calibration process, on the other hand.

By contrast, the coil 130 described herein may be used to generate an inhomogeneous field having comparable field strength. This requires just 56 mW, which leads to a magnetic flux density of 8.3 mT. This would be equivalent to the previously described homogeneous magnetic field with 35.4 mT for 0.25 W. Due to the much lower power consumption of the coils 130 described herein, the coils produce much less waste heat of merely 1° C. This improves the calibration process considerably.

Another advantage of the sensor chip 100 described herein is that the inhomogeneous magnetic field generated by the coils 130 does not extend far into open space, which means that no interference arises due to nearby metal parts and corresponding induction currents. Additionally, the arrangement of two z magnetic field sensors 101, 102 measuring in opposite z directions removes homogeneous stray fields.

In summary, it may be stated that the coil 130 may initially have an even number of spiral windings 210, 220. These may be provided as spiral winding pairs 230. One of the two spiral windings 210, 220 of a spiral winding pair 230 may run from the outside to the inside, and the other of the two spiral windings 210, 220 may run back from the inside to the outside. The two spiral windings may be connected in series for this purpose, for example at the respective innermost turns 140, 144 thereof.

The spiral windings 210, 220 may be produced by means of so-called interconnect metallization layers M1, . . . , M5. Each spiral winding 210, 220 may be configured as a single-layer spiral winding or as a multilayer spiral winding. In the case of a multilayer spiral winding 210, at least two layers may be connected up to one another in parallel, e.g. by means of vertical plated-through holes (vias). The metal layers may have vertical plated-through holes over more than 30% of their total length. When at least one multilayer spiral winding 210 is used, the aforementioned series connection of the two spiral windings 210, 220 corresponds to a parallel connection of all layers M1, M2, M3, M4, M5 of the two spiral windings 210, 220.

The width of the individual turns of the spiral windings 210, 220 in different layers and at the same radial distance from the center 116 may be chosen such that they have the same averaged power-density or current-density distribution, a deviation of +30% also being included here.

The width of the individual turns of the spiral windings 210, 220 may either be constant or decrease as the radial distance from the center 116 increases. The width of the turns may decrease by the factor 1~sqrt(r). The innermost turn 140, 144 may in each case be only half as wide as a turn that corresponds to the factor 1~sqrt(r).

The packing density of the thickest metallization layer M5 may be at least 70%, or at least 80%.

If the z magnetic field sensor 101, 102 is almost circular, the spiral coils 130, 330 are also almost circular. In the case of a hexagonal or square z magnetic field sensor 101, 102, the coils 130, 330 may be almost hexagonal or square.

The concept described herein has multiple advantages:
a) Since the integrated coils 130, 330 are small, their magnetic field does not extend far into space. The magnetic field therefore reaches no iron parts on the production line, which would cause a negative influence.
b) The integrated coils 130, 330 are situated on the device under test. In the case of a multi-temperature test, the coil 130, 330 does not change—even if the coils 130, 330 have a certain mismatch, the same coils 130, 330 are always situated above each z magnetic field sensor 101, 102. This distinctly improves the accuracy of a z sensor calibration over a specific temperature range.
c) Since each device under test has its own coil 130, 330, the test engineer is able to adapt the number of devices to be tested simultaneously—both at wafer level and following assembly of the packages.
d) The coils 130, 330 are so small that their inductance is also correspondingly low. Their time constant is therefore small. This allows the test to be performed more quickly, which therefore makes it less expensive.
e) Additionally, the field from the tiny coils 130, 330 reaches no large conductive (metal) parts of the test equipment. This avoids eddy currents when the coils 130, 330 are switched on and off, and this in turn speeds up the calibration sequence.
f) The coils 130, 330 are manufactured with the accuracy of the semiconductor process (accuracy for structuring the coil turns and producing their (layer) thicknesses). This accuracy is generally very exact and highly precise. In addition, the semiconductor manufacturer has complete control over the accuracy (whereas the magnet is generally manufactured by an external provider).

The example implementations described above are merely an illustration of the principles of the innovative concept described herein. It goes without saying that modifications and variations of the arrangements and details described herein will be apparent to other persons skilled in the art. The intention is therefore that the concept described herein will be limited merely by the scope of protection of the patent claims that follow rather than by the specific details that have been presented herein based on the description and the explanation of the example implementations.

Although some aspects have been described in connection with an apparatus, it goes without saying that these aspects are also a description of the corresponding method, which means that a block or an element of an apparatus is also intended to be understood to mean a corresponding method step or to mean a feature of a method step. Similarly, aspects that have been described in connection with or as a method step are also a description of a corresponding block or detail or feature of a corresponding apparatus.

Some or all of the method steps may be carried out by a hardware apparatus (or by using a hardware apparatus), such as a microprocessor, a programmable computer or an electronic circuit. In some example implementations, some or a plurality of the most important method steps may be carried out by such an apparatus.

Depending on specific implementation requirements, example implementations may be implemented in hardware or in software or at least partly in hardware or at least partly in software. The implementation may be carried out by using a digital storage medium, for example a floppy disk, a DVD, a Blu-ray disk, a CD, a ROM, a PROM, an EPROM, an EEPROM or a FLASH memory, a hard disk or another magnetic or optical memory that stores electronically readable control signals that are able to interact or do interact with a programmable computer system in such a way that the respective method is carried out. The digital storage medium may therefore be computer-readable.

Some example implementations thus comprise a data carrier that has electronically readable control signals capable of interacting with a programmable computer system in such a way that one of the methods described herein is carried out.

In general, example implementations may be implemented as a computer program product with a program code, the program code being effective for carrying out one of the methods when the computer program product runs on a computer.

The program code may also be stored on a machine-readable medium, for example.

Other example implementations comprise the computer program for carrying out one of the methods described herein, the computer program being stored on a machine-readable medium. In other words, an example implementation of the method described herein is therefore a computer program that has a program code for carrying out one of the methods described herein when the computer program runs on a computer.

Another example implementation of the method described herein is therefore a data carrier (or a digital storage medium or a computer-readable medium) on which the computer program for carrying out one of the methods described herein has been recorded. The data carrier or the digital storage medium or the computer-readable medium are typically tangible and/or nonvolatile.

Another example implementation of the method described herein is therefore a data stream or a sequence of signals that represent(s) the computer program for carrying out one of the methods described herein. By way of example, the data stream or the sequence of signals may be configured to be transferred via a data communication connection, for example via the Internet.

Another example implementation comprises a processing device, for example a computer or a programmable logic element, that is configured or adapted to carry out one of the methods described herein.

Another example implementation comprises a computer on which the computer program for carrying out one of the methods described herein is installed.

Another example implementation comprises an apparatus or a system that is configured to transmit a computer program for carrying out at least one of the methods described herein to a receiver. The transmission may be effected electronically or optically, for example. The receiver may be a computer, a mobile device, a memory device or a similar apparatus, for example. The apparatus or the system may comprise a file server for transmitting the computer program to the receiver, for example.

In some example implementations, a programmable logic element (for example a field programmable gate array, an FPGA) may be used to carry out some or all functionalities of the methods described herein. In some example implementations, a field programmable gate array is able to interact with a microprocessor in order to carry out one of the methods described herein. In general, the methods in some example implementations are carried out by an arbitrary hardware apparatus. This may be a piece of universally useable hardware such as a computer processor (CPU) or hardware that is specific to the method, such as an ASIC.

What is claimed is:

1. A sensor chip having
at least two magnetic field sensors that are arranged adjacently to one another on the sensor chip and measure perpendicularly to a chip plane,
wherein at least one magnetic field sensor of the at least two magnetic field sensors has a planar coil arranged on the at least one of the magnetic field sensor that is configured to generate a magnetic field directed perpendicularly to the chip plane, and
a controller that is configured
to operate the at least two magnetic field sensors in a calibration mode, in which an input signal is applied to the planar coil in order to generate the magnetic field, and
to determine from each of the at least two magnetic field sensors a response signal for the generated magnetic field, and,
for a purpose of calibrating the at least two magnetic field sensors, to take a differential measurement involving the response signal from one magnetic field sensor, of the at least two magnetic field sensors, being subtracted from the response signal from another magnetic field sensor, of the at least two magnetic field sensors.

2. The sensor chip as claimed in claim 1,
wherein the planar coil is arranged on an area of the at least one magnetic field sensor that is opposite the sensor chip.

3. The sensor chip as claimed in claim 1,
wherein the planar coil has multiple turns, and
wherein, viewed in a plan view of the chip plane, at least 90% of the multiple turns of the planar coil are arranged inside an outer contour of the at least one magnetic field sensor.

4. The sensor chip as claimed in claim 3,
wherein at least an outermost turn of the multiple turns of the planar coil runs parallel to the outer contour of the at least one magnetic field sensor and has approximately a same geometric shape as the outer contour of the at least one magnetic field sensor.

5. The sensor chip as claimed in claim 1,
wherein the planar coil is at ground potential.

6. The sensor chip as claimed in claim 1,
wherein each of the at least two magnetic field sensors has a planar coil arranged thereon.

7. The sensor chip as claimed in claim 6,
wherein the controller is further configured to operate the planar coil of two adjacent magnetic field sensors, of the at least two magnetic field sensors, in such a way that the two adjacent magnetic field sensors generate oppositely directed magnetic fields.

8. The sensor chip as claimed in claim 1,
wherein the planar coil is of a spiral design and has a spiral winding pair having two spiral windings,
wherein one of the two spiral windings is an inwardly wound spiral winding that winds from an outside to an inside and wherein another of the two spiral windings is an outwardly wound spiral winding that winds from the inside to the outside, and
wherein the two spiral windings each have a same direction of rotation.

9. The sensor chip as claimed in claim 8,
wherein the inwardly wound spiral winding is electrically connected, in series, with the outwardly wound spiral winding.

10. The sensor chip as claimed in claim 8,
wherein at least one of the two spiral windings of the spiral winding pair has at least four turns.

11. The sensor chip as claimed in claim 8,
wherein the two spiral windings of the spiral winding pair are produced in respective different metallization layers using micro-structuring technology.

12. The sensor chip as claimed in claim 8,
wherein one of the two spiral windings of the spiral winding pair is a multilayer spiral winding produced from at least two metallization layers of spiral design arranged above one another.

13. The sensor chip as claimed in claim 8, wherein:
if a layer thickness of a first spiral winding of the two spiral windings is greater by a factor x than a layer thickness of a second spiral winding of the two spiral windings, each individual turn of the first spiral winding has a lateral turn width that is less by the factor x than a lateral turn width of each individual turn of the second spiral winding.

14. The sensor chip as claimed in claim 12,
wherein the at least two metallization layers of the multilayer spiral winding are connected to one another, in parallel, using a multiplicity of vertical plated-through holes.

15. The sensor chip as claimed in claim 14,
wherein the at least two metallization layers of the multilayer spiral winding have vertical plated-through holes over more than 30% of a total length of each metallization layer, of the at least two metallization layers.

16. The sensor chip as claimed in claim 12,
wherein another of the two spiral windings of the spiral winding pair is likewise a multilayer spiral winding produced from at least two metallization layers of spiral design arranged above one another, and
wherein innermost turns of each of the two spiral windings of the spiral winding pair are electrically connected to one another.

17. The sensor chip as claimed in claim 12,
wherein another of the two spiral windings of the spiral winding pair is a single-layer spiral winding produced from precisely one metallization layer of spiral design.

18. The sensor chip as claimed in claim 17,
wherein respective innermost turns of the multilayer spiral winding of the spiral winding pair are electrically connected to an innermost turn of the single-layer spiral winding of the spiral winding pair.

19. The sensor chip as claimed in claim 17,
wherein the metallization layer of the single-layer spiral winding has a layer thickness that is greater than a layer thickness of a single metallization layer of the multilayer spiral winding.

20. The sensor chip as claimed in claim 17,
wherein the metallization layer of the single-layer spiral winding has a layer thickness that is just as great as a sum of all of layer thicknesses of the at least two metallization layers of the multilayer spiral winding together.

* * * * *